(12) United States Patent
Toda et al.

(10) Patent No.: US 9,020,332 B2
(45) Date of Patent: Apr. 28, 2015

(54) CENTER ROD FOR USE IN THE CARBURETOR OR CARBURETOR FOR MOCVD

(71) Applicants: WACOM R&D Corporation, Tokyo (JP); Masayuki Toda, Fukushima (JP)

(72) Inventors: Masayuki Toda, Fukushima (JP); Masaru Umeda, Tokyo (JP)

(73) Assignees: Wacom R&D Corporation, Tokyo (JP); Masayuki Toda, Fukushima (JP)

(*) Notice: Subject to any disclaimer, the term of this patent is extended or adjusted under 35 U.S.C. 154(b) by 0 days.

(21) Appl. No.: 14/520,537

(22) Filed: Oct. 22, 2014

(65) Prior Publication Data

US 2015/0053137 A1 Feb. 26, 2015

Related U.S. Application Data

(62) Division of application No. 13/147,668, filed as application No. PCT/JP2010/051054 on Jan. 27, 2010, now Pat. No. 8,897,627.

(30) Foreign Application Priority Data

Feb. 3, 2009 (JP) ................................ 2009-023063

(51) Int. Cl.
*A01G 13/06* (2006.01)
*A61M 16/00* (2006.01)
*C23C 16/448* (2006.01)
*B01B 1/00* (2006.01)

(52) U.S. Cl.
CPC ................................ *C23C 16/4481* (2013.01)

(58) Field of Classification Search
None
See application file for complete search history.

(56) References Cited

U.S. PATENT DOCUMENTS

| | | | |
|---|---|---|---|
| 4,111,365 A | 9/1978 | Kimbara | |
| 6,036,783 A | 3/2000 | Fukunaga et al. | |
| 6,062,499 A | 5/2000 | Nakamura et al. | |
| 6,540,840 B1 | 4/2003 | Toda et al. | |
| 7,246,796 B2 | 7/2007 | Toda et al. | |
| 7,673,856 B2 | 3/2010 | Toda et al. | |
| 2014/0050852 A1 | 2/2014 | Umenda et al. | |

FOREIGN PATENT DOCUMENTS

| | | |
|---|---|---|
| JP | 2004-010969 | 1/2004 |
| JP | 2005-072194 | 3/2005 |

OTHER PUBLICATIONS

International Search Report—PCT/JP2010/051054—Mar. 2, 2010.

*Primary Examiner* — Thor Campbell
(74) *Attorney, Agent, or Firm* — Young & Thompson

(57) ABSTRACT

Provided is a vaporizer that can efficiently cool a carrier gas, improve the effect of preventing a material from being clogged near the outlet port of a gas passage, contribute to prolonging the timing of maintenance and improving operating efficiency, and exert more uniform dispersing effect. A vaporizer includes: a center rod inserted into a carrier gas introduction hole formed in a disperser to form the gas passage in cooperation with the inner wall of the carrier gas introduction hole; a cooling part disposed on the outer circumferential side of the carrier gas introduction hole in the disperser to cool the inside of the gas passage; a cooling member insertion hole formed across almost the entire length of the center rod along the axial direction of the center rod; and a cooling member disposed in the inside of the cooling member insertion hole to cool the center rod.

11 Claims, 7 Drawing Sheets

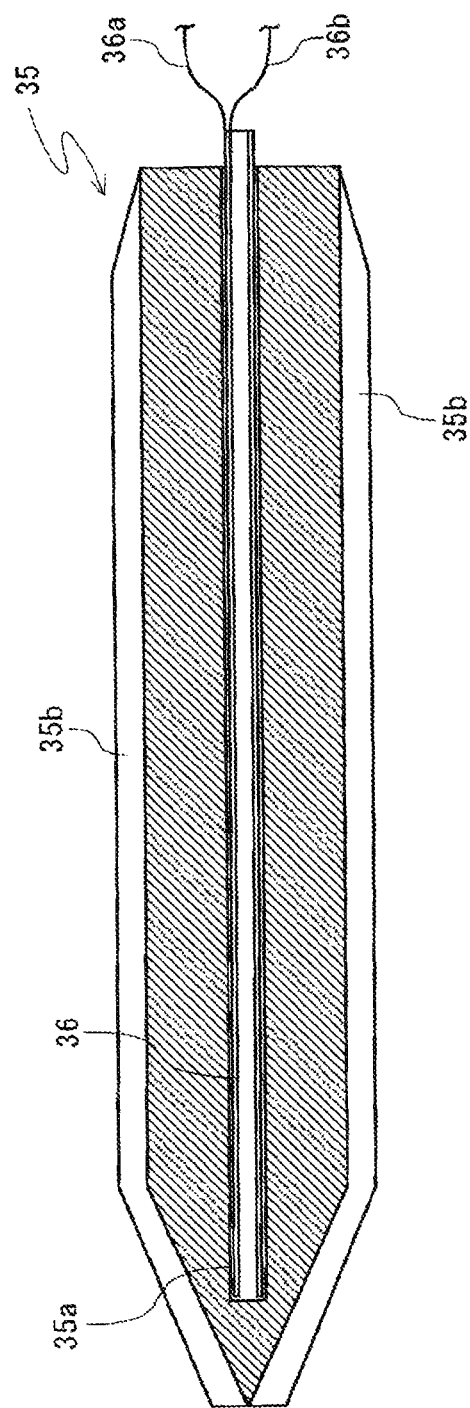
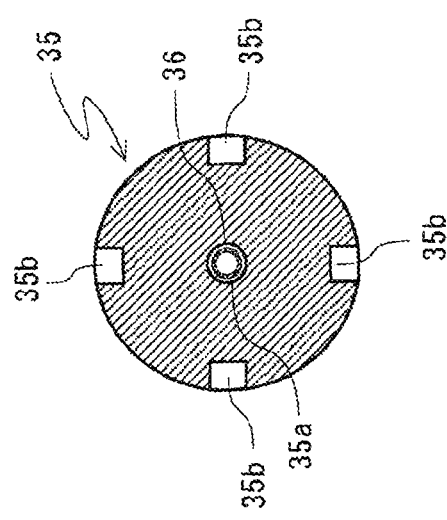
FIG. 2A
FIG. 2B

CENTER ROD FOR USE IN THE CARBURETOR OR CARBURETOR FOR MOCVD

TECHNICAL FIELD

The present invention relates to a vaporizer for vaporizing a raw material solution or the like made of a plurality of thin film forming materials using a carrier gas, a MOCVD vaporizer using the vaporizer, a center rod for use in the vaporizer or the MOCVD vaporizer, a method for dispersing a carrier gas, and a method for vaporizing a carrier gas.

BACKGROUND ART

In these years, in the field of electronic devices, it is desired to further downsize electronic devices and to improve the performance of electronic devices as well as to increase the density of circuits. It becomes advantageous not only to simply attain the functions of electronic devices only by circuitry configurations, like a SRAM (Static Random Access read write Memory) and an EEPROM (Electrically Erasable and Programmable Read Only Memory) that perform information storage operations by combining transistors, or a DRAM (Dynamic Random Access Memory) or the like that performs information storage operations by combining a transistor and a capacitor, for example, but also to implement the functions of devices utilizing the characteristics of materials themselves such as functional thin films.

Furthermore, such semiconductors are mounted for the IC chip of a credit card or the like, for example, and the technology is being diversified into a personal information memory chip for a passport or the like.

Thus, it is demanded to reduce the thickness of a dielectric material or the like used for electronic components. There is CVD for a method of reducing the thickness of such a material.

This CVD has characteristics including a film deposition rate higher than that of PVD, sol-gel, and other methods, and easy fabrication of a multi-layer thin film. Moreover, MOCVD is CVD using a compound containing an organic substance for a raw material for forming a thin film, having such advantages that safety is high and halides are not mixed into films.

Raw materials used for MOCVD are generally solid powder or liquid. These raw materials are put in a container, the raw materials are typically heated at a subatmospheric pressure and vaporized in a vaporizer, and then the materials are supplied into a thin film deposition device using a carrier gas.

FIG. 7 is a system block diagram depicting a vaporization system for such MOCVD (see Patent Document 1).

In FIG. 7, 10 denotes a supply unit that supplies a plurality of raw material solutions and the like to a vaporizer 1.

The supply unit 10 includes a gas cylinder 11 filled with a carrier gas (for example, $N_2$ or Ar), an oxygen cylinder 12 filled with oxygen, a water storage tank 13 having cooling water stored therein, a plurality of reserve tanks 14 to 17 having raw materials for ferroelectric thin films stored therein (for example, $Sr(DPM)_2$, $Bi(C_6H_5)_3$, and $Ta(OC_2H_5)_5$) for three kinds of organometallic complexes, and THF (tetrahydrofuran) for a solvent), a gas supply pipe 18 connected to the gas cylinder 11 and the vaporizer 1, an oxygen supply pipe 19 connected to the oxygen cylinder 12 and the vaporizer 1, a water supply pipe 20 and 6a distributing pipe 21 connected to the water storage tank 13 and the vaporizer 1, liquid supply pipes 22 to 25 connected to the reserve tanks 14 to 17 and the vaporizer 1, and a manifold 26 connected to the reserve tanks 14 to 17 and the gas cylinder 11.

A valve 18a and a mass flow controller 18b are provided in the path of the gas supply pipe 18. A valve 19a, a mass flow controller 19b, and a valve 19c are provided in the path of the oxygen supply pipe 19. A valve 20a is provided in the path of the water supply pipe 20. Moreover, a valve 22a and a mass flow controller 22b are provided in the path of the liquid supply pipe 22 for a solvent. Valves 23a to 25a and mass flow controllers 23a to 25b are provided in the path of the liquid supply pipes 23 to 25 for complexes. Valves 26a to 26d, an air purge 26e, and a valve 26f are provided in the path of the manifold 26. It is noted that the liquid supply pipes 23 to 25 are branched so as to connect to the liquid supply pipe 22, and provided with valves 23c to 25c, respectively.

The valve 18a of the gas supply pipe 18 is opened to control the flow rate of a carrier gas filled in the gas cylinder 11 by the mass flow controller 18b, and the carrier gas is supplied to the vaporizer 1. Moreover, for the carrier gas filled in the gas cylinder 11, the valve 26f of the manifold 26 and the valves 26a to 26d are opened and the releasing state of the valve 26e for the air purge is closed, so that the carrier gas is supplied to the reserve tanks 14 to 17. Thus, the carrier gas applies pressure to the insides of the reserve tanks 14 to 17, and the stored raw material solutions are each pressed upward in the insides of the liquid supply pipes 22 to 25 each having the tip end facing the solution, the flow rates are controlled by the mass flow controllers 22b to 25b, and then the raw material solutions are carried to the vaporizer 1.

Furthermore, at the same time, oxygen (an oxidizer) controlled at a constant flow rate by the mass flow controller 19b is carried from the oxygen cylinder 12 to the vaporizer 1.

Moreover, the valve 20a of the water supply pipe 20 is opened to circulate the cooling water in the water storage tank through the inside of the vaporizer 1 for cooling the vaporizer 1.

It is noted that although the thin film forming material supply parts 27 to 30 are arranged side by side along the axial direction of the vaporizer 1 in the example in the drawing, in reality the thin film forming material supply parts 27 to 30 are radially and alternately provided using connecting parts 31 and 32 connected to the water supply pipe 20 or the distributing pipe 21 from the water storage tank 13.

Since the raw material solutions stored in the insides of the reserve tank 15 to 17 have organometallic complexes, (Sr $(DPM)_2$, $Bi(C_6H_5)_3$, and $Ta(OC_2H_5)_5$), in liquid or solid solved in THF, a solvent, at room temperature, the organometallic complexes are precipitated by evaporating the THF solvent and finally made in a solid if allowed to stand.

Thus, in order to prevent the solid organometallic complexes from blocking the insides of the liquid supply pipes 23 to 25 contacted to the undiluted solutions, it is sufficient to clean the insides of the liquid supply pipes 23 to 25 and the inside of the vaporizer 1 after film deposition with THF in the inside of the reserve tank 14. The cleaning at this time is performed in the section from the outlet port side of the mass flow controllers 13b to 25b to the vaporizer 1, using THF stored in the inside of the reserve tank 14 after processing.

FIG. 5 is a cross sectional view depicting an exemplary configuration of the essential part of the vaporizer 1 (see Patent Document 1).

In the vaporizer 1 shown in FIG. 5, the vaporizer 1 includes a disperser (a dispersing unit main body) 2 to which the gas supply pipe 18 is connected, a reaction pipe 3 continuously connected to the downstream side of the disperser 2, and a heater 4 that covers the circumferential portion of the reaction pipe 3.

The disperser 2 has a gas passage 5 positioned coaxially with the gas supply pipe 18. The tip ends of the thin film forming material supply parts 27 to 30 are faced between a start upstream port 5a and an end jet port 5b of the gas passage 5 (only the thin film forming material supply parts 28 and 29 are shown as faced to each other in the drawing), so that the raw material solutions stored in the insides of the reserve tank 15 to 17 can be supplied to the inside of the gas passage 5. Moreover, the disperser 2 is formed with a cooling path 6 communicating with the connecting parts 31 and 32 for circulating the cooling water in the inside of the water storage tank 13. Furthermore, the disperser 2 includes a center rod 7 having one end positioned at the upstream side more than the start upstream port 5a of the gas supply pipe 18 and the other end positioned at the end jet port 5b, and a pin 8 that supports the tip end side of this center rod 7 (the downstream side of the gas passage 5). It is noted that the base end side of the center rod 7 (the upstream side of the gas passage 5) is supported by a pin 9 provided near the end portion of the gas supply pipe 18.

In such a configuration, a carrier gas introduction hole is cut through the inside of the disperser 2, and the center rod 7 having the outer diameter (4.48 mm) smaller than the inner diameter (4.50 mm) of the carrier gas introduction hole is provided so as to be positioned coaxially with the axis of the carrier gas introduction hole.

Moreover, the gas passage 5 is formed in cooperation with the inner wall of the carrier gas introduction hole and the center rod 7 of this disperser 2.

It is noted that the cross sectional width of the gas passage 5 is 0.02 mm. At this time, preferably, the cross sectional width of the gas passage 5 ranges from 0.005 to 0.10 mm. This is because processing is difficult when the cross sectional width is below 0.005 mm, whereas it is necessary to use a high pressure carrier gas in order to increase the rate of the carrier gas when the cross sectional width exceeds 0.10 mm.

A carrier gas is introduced from the gas supply pipe 18 from the upstream of the gas passage 5. Since the raw material solutions are dropped onto this carrier gas from the tip ends of the thin film forming material supply parts 27 to 30 positioned in the midway of the gas passage 5, these raw material solutions are dispersed into the carrier gas passing through the gas passage 5 for mist.

Thus, the carrier gas having the raw material solutions dispersed therein is issued from the end jet port 5*b* on the downstream of the gas passage 5 to the reaction pipe 3, the carrier gas having the raw material solutions dispersed therein, which flows through the inside of the reaction pipe 3, is heated and vaporized with the heater 4, and then the carrier gas is supplied to a thin film deposition device, not shown in the drawing.

Now, for the cooling part provided in the vaporizer 1, the cooling path 6 is formed across almost the entire length of the gas passage 5 as described above. In addition to this, for example, as shown in FIG. 6, such a configuration is known that a cooling system 33 is provided for cooling the inside of a gas passage 5 positioned in the midway to the tip end side of a center rod 7 (for example, see Patent Document 2).

It is noted that in FIG. 6, functions similar to those of the aforementioned vaporizer 1 shown in FIG. 5 are designated the same reference numerals and signs and the descriptions are omitted.

RELATED ART DOCUMENTS

Patent Documents

Patent Document 1: JP 2008-001994 A
Patent Document 2: JP 2004-265938 A

SUMMARY OF THE INVENTION

Problems that the Invention is to Solve

Now, in the vaporizer 1 configured as described above, such a phenomenon occurred that thin film raw materials are attached around the end jet port 5*b* of the vaporizer 1.

Namely, since the inside of the gas passage 5 is in a high temperature environment, if moisture in the raw material solutions in mist in the carrier gas passing through the gas passage 5 (more particularly, the carrier gas after raw material solutions are dispersed therein) is evaporated before the carrier gas reaches the end jet port 5*b*, the powder components or the like of the materials are attached around the end jet port 5*b*. Moreover, such powder components or the like of the materials grow with time to be a cause to clog the end jet port 5*b* as well as to raise the possibility of developing a problem of mixing impurities.

Therefore, in order to meet a higher temperature environment in the inside of the gas passage 5, the cooling path 6 is formed on the outer circumferential side than the gas passage 5, and cooling water is circulated through the cooling path 6 for cooling the gas passage 5.

However, since the cooling path 6 is formed in the disperser 2, a problem arises in that cooling effect is poor such as the occurrence of heat loss by the wall thickness of the disperser 2 dividing the gas passage 5 from the cooling path 6 because the gas passage 5 is indirectly cooled from the outside of the gas passage 5 using heat transfer effect.

In order to solve the aforementioned problems, it is an object of the present invention to provide a vaporizer that can efficiently cool a carrier gas, improve the effect of preventing a material from being clogged near the outlet port of a gas passage, contribute to prolonging the timing of maintenance and improving operating efficiency, and exert more uniform dispersing effect.

Means for Solving the Problems

In order to achieve the object, a vaporizer includes: a center rod inserted into a carrier gas introduction hole formed in a dispersing unit main body to form a gas passage in cooperation with an inner wall of the carrier gas introduction hole; a cooling part disposed on an outer circumferential side of the carrier gas introduction hole in the dispersing unit main body and configured to cool an inside of the gas passage; a cooling member insertion hole formed across almost an entire length of the center rod along an axial direction of the center rod; and a cooling member disposed in an inside of the cooling member insertion hole and configured to cool the center rod.

It is then possible to efficiently cool a carrier gas using the cooling part and the cooling member.

Moreover, a vaporizer according to a preferred embodiment, the vaporizer includes: a center rod inserted across an entire length of a carrier gas introduction hole formed in a dispersing unit main body to forma gas passage in cooperation with an inner wall of the carrier gas introduction hole; a thin film forming material supply part formed at a plurality of places in the dispersing unit main body and configured to supply a plurality of thin film forming materials to a midway of the gas passage; a cooling part disposed on an outer circumferential side of the carrier gas introduction hole in the dispersing unit main body and configured to cool an inside of the gas passage; a cooling member insertion hole formed across almost an entire length of the center rod along an axial direction of the center rod; and a cooling member disposed in an inside of the cooling member insertion hole and configured to cool the center rod.

With that preferred embodiment, it is possible to efficiently cool a carrier gas including the carrier gas having the thin film forming materials dispersed therein, the thin film forming materials being supplied from the thin film forming material supply parts.

In another preferred embodiment, the cooling part and the cooling member are disposed across from at least near the thin film forming material supply part to near a downstream end of the gas passage.

With that preferred embodiment, it is possible to efficiently cool the carrier gas having the thin film forming materials dispersed therein, the thin film forming materials being supplied from the thin film forming material supply parts.

A MOCVD vaporizer according to yet another preferred embodiment includes a vaporizing part provided adjacent to the vaporizer and configured to vaporize a carrier gas having a plurality of thin film forming materials dispersed therein in the dispersing unit main body.

The MOCVD vaporizer can improve the effect of preventing the clogging of the material of a carrier gas efficiently cooled using the cooling part and the cooling member, contribute to prolonging the timing of maintenance and improving operating efficiency, and exert more uniform dispersing effect.

A center rod according to a preferred embodiment is a center rod for use in the vaporizer or the MOCVD vaporizer, wherein the center rod includes a plurality of guide grooves formed on an outer circumferential portion of the center rod, the plurality of guide grooves corresponding to thin film forming materials to be applied one to one.

The cooling member can be a Peltier element in a nearly cylindrical shape.

The cooling member can be a heat pipe having a heat absorption part disposed in the cooling member insertion hole.

The cooling member can be a spiral or nearly U-shaped cold water pipe, to and from which cooling water is supplied and drained through a pump.

The cooling member can be removably inserted into the center rod.

A method for cooling and dispersing a carrier gas includes the steps of: introducing a carrier gas having a plurality of thin film forming materials dispersed therein into a gas passage formed between an inner wall of a carrier gas introduction hole formed in a dispersing unit main body and a center rod inserted into the carrier gas introduction hole; and carrying the carrier gas having the thin film forming materials dispersed therein through the inside of the gas passage while cooling the carrier gas having the thin film forming materials dispersed therein using a cooling part disposed in the dispersing unit main body and a cooling member disposed in the center rod.

It is possible to introduce a carrier gas efficiently cooled using the cooling part and the cooling member.

Moreover, an alternate method for vaporizing a carrier gas includes steps of: introducing a carrier gas into a gas passage formed between an inner wall of a carrier gas introduction hole formed in a dispersing unit main body and a center rod inserted into the carrier gas introduction hole; and introducing thin film forming materials from a plurality of places in a midway of the gas passage to disperse the thin film forming materials into the carrier gas, joining the carrier gas having the thin film forming materials dispersed therein at a joining part where a center rod tip end disposed on a downstream end portion of the gas passage guides the thin film forming materials in a direction to come close to each other, and then vaporizing the carrier gas, wherein the carrier gas having the thin film forming materials dispersed therein is guided to the joining part while cooling the carrier gas having the thin film forming materials dispersed therein using a cooling part disposed in the dispersing unit main body and a cooling member disposed in the center rod, the thin film forming materials being introduced from at least the plurality of places in the midway of the gas passage.

It is then possible to contribute to vaporizing a carrier gas with few impurities mixed.

Effect of the Invention

The vaporizer according to the present invention can efficiently cool a carrier gas, improve the effect of preventing a material from being clogged near the outlet port of a gas passage, contribute to prolonging the timing of maintenance and improving operating efficiency, and exert more uniform dispersing effect.

BRIEF DESCRIPTION OF THE DRAWINGS

FIG. 2A is a vertical cross sectional view depicting a center rod 35 applied to the MOCVD vaporizer according to the present invention, and FIG. 2B is a cross sectional view depicting the center rod 35 applied to the MOCVD vaporizer according to the present invention;

DESCRIPTION OF REFERENCE NUMERALS AND SIGNS

Figure 1:
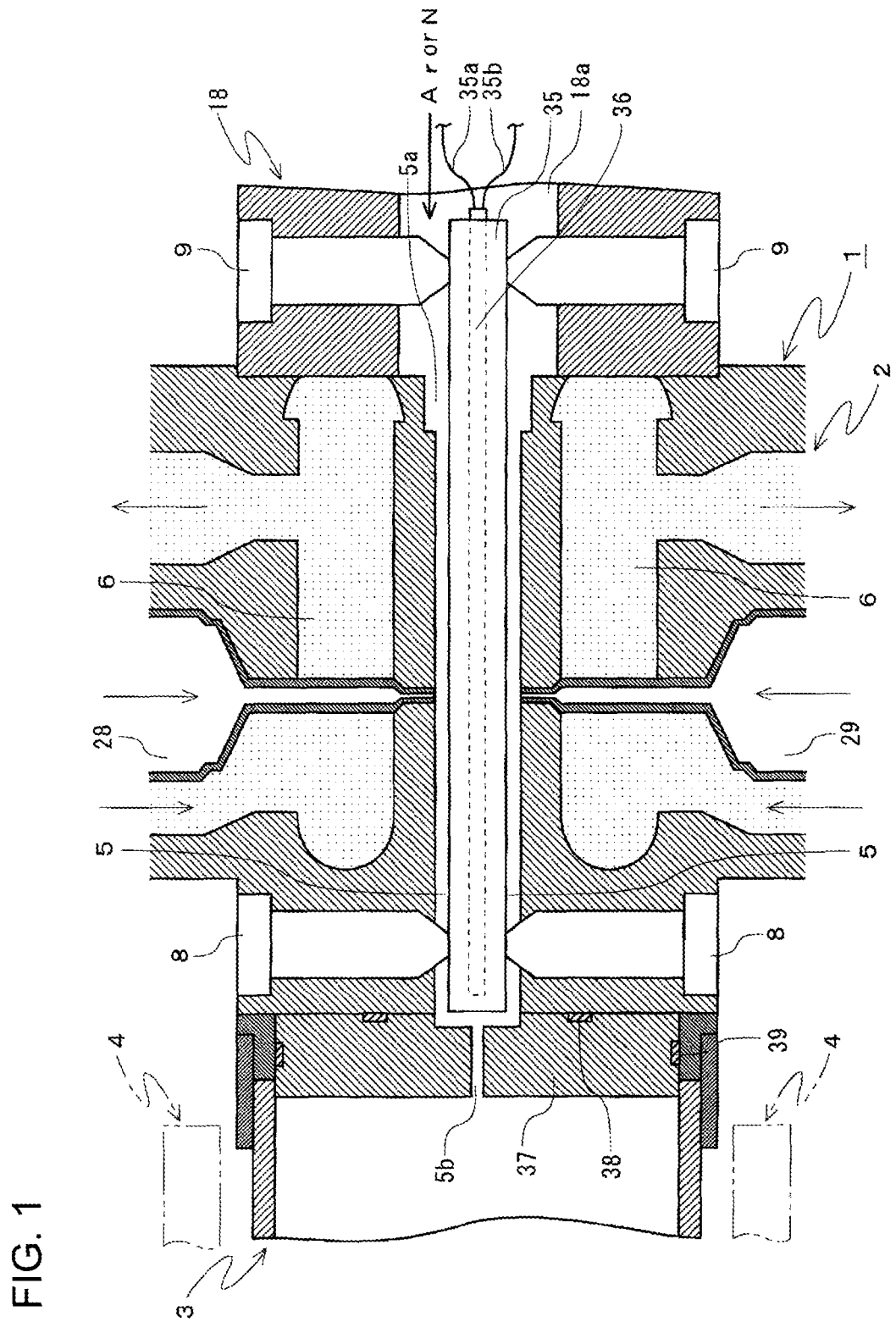
FIG. 1 is a cross sectional view depicting the essential part of an embodiment of a MOCVD vaporizer according to the present invention.

1 Vaporizer
2 Disperser (dispersing unit main body)
3 Reaction pipe
4 Heater
5 Gas passage
   5a Start upstream port
   5b End jet port (joining part)
6 Cooling passage
7 Center rod
8 Pin
9 Pin
10 Supply unit
11 Gas cylinder
12 Oxygen cylinder 13 Water storage tank
14 Reserve tank
15 Reserve tank
16 Reserve tank
17 Reserve tank
18 Gas supply pipe
    18$b$ Mass flow controller
    18$b$ Mass flow controller
19 Oxygen supply pipe
    19$a$ Valve
    19$b$ Mass flow controller
    19$c$ Valve
20 Water supply pipe
    20$a$ Valve
21 Distributing pipe
22 Liquid supply pipe
    22$a$ Valve
    22$b$ Mass flow controller
    22$c$ Valve
23 Liquid supply pipe
    23$a$ Valve
    23$b$ Mass flow controller
    23$c$ Valve
24 Liquid supply pipe
    24$a$ Valve
    24$b$ Mass flow controller
    24$c$ Valve
25 Liquid supply pipe
    25$a$ Valve
    25$b$ Mass flow controller
    25$c$ Valve
26 Manifold
    26$a$ Valve
    26$b$ Valve
    26$c$ Valve
    26$d$ Valve
    26$e$ Air purge
    26$f$ Valve
27 Thin film forming material supply part
28 Thin film forming material supply part
29 Thin film forming material supply part
30 Thin film forming material supply part
31 Connecting part
32 Connecting part
33 Cooling system
35 Center rod
    35$a$ Cooling member insertion hole
    35$b$ Guide groove
36 Cooling member
37 Anti-radiation part
38 Sealing member
39 Sealing member

MODE FOR CARRYING OUT THE INVENTION

Figure 7:
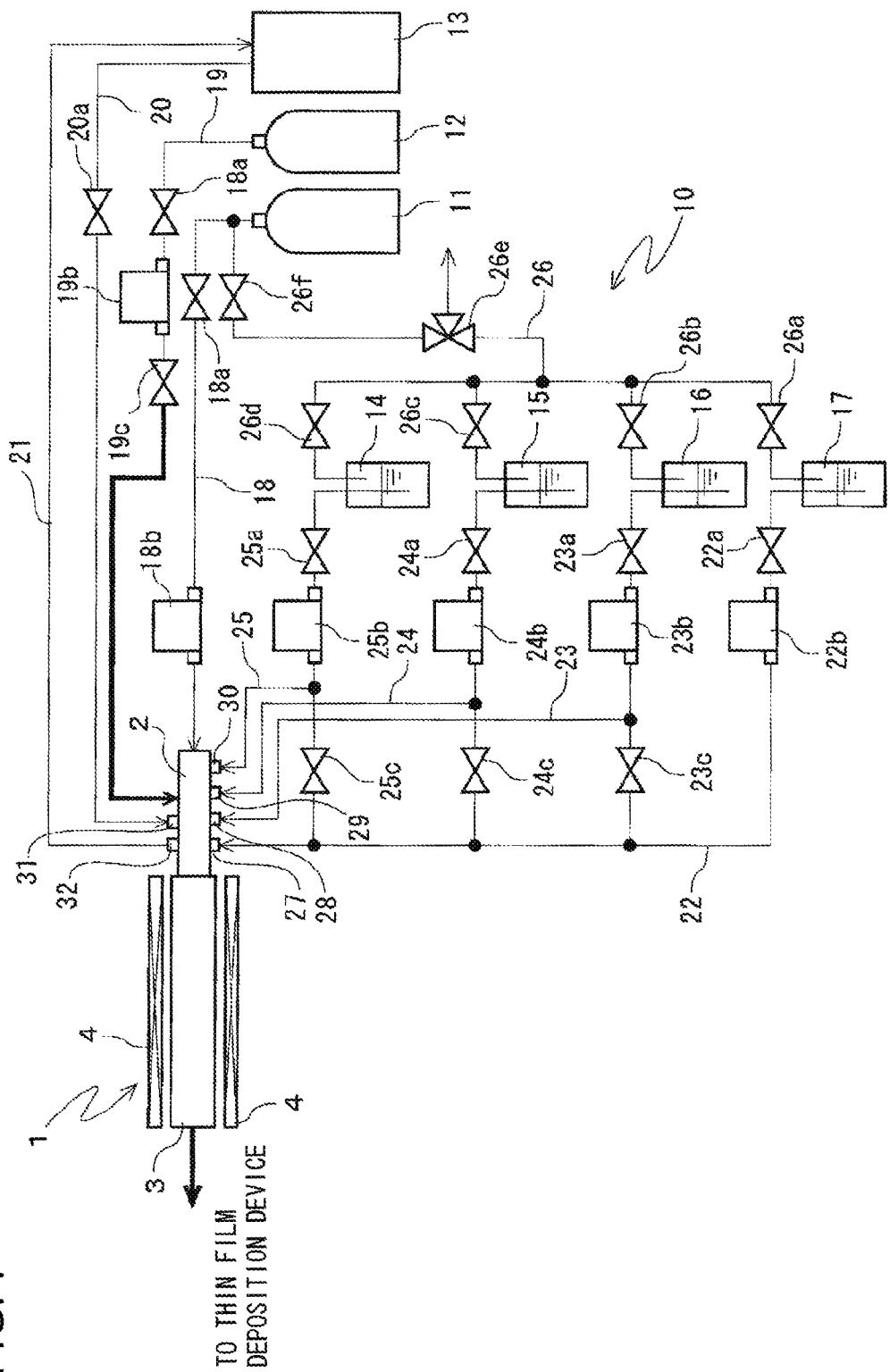
FIG. 7 is a system block diagram depicting a MOCVD vaporization system.

Next, a MOCVD vaporizer according to the present invention will be described with reference to the drawings. It is noted that since the appearance of the system configuration of a raw material supply system or the like is the same as that shown in FIG. 7 in the following embodiments, the detailed description of the overall system is omitted.

FIG. 1 is a cross sectional view depicting the essential part of an embodiment of a MOCVD vaporizer according to the present invention, FIG. 2A is an enlarged vertical cross sectional view depicting a center rod, and FIG. 2B is an enlarged cross sectional view depicting the center rod.

In FIG. 1, a vaporizer 1 includes a center rod 35 inserted into a carrier gas introduction hole formed in a disperser (a dispersing unit main body) 2 to form a gas passage 5 in cooperation with the inner wall of the carrier gas introduction hole, a cooling path 6 disposed on the outer circumferential side of the carrier gas introduction hole in the disperser 2 to cool the inside of the gas passage 5, a cooling member insertion hole 35$a$ formed across almost the entire length of the center rod 35 along the axial direction of the center rod 35, and a cooling member 36 disposed in the inside of the cooling member insertion hole 35$a$ to cool the center rod 35.

Moreover, the disperser 2 is provided with thin film forming material supply parts 27 to 30 formed at a plurality of places in the disperser 2 to supply a plurality of thin film forming materials to the midway of the gas passage 5 (only the thin film forming material supply parts 28 and 29 are shown as faced to each other in FIG. 1).

At this time, the cooling path 6 and the cooling member 36 are disposed across from at least near the thin film forming material supply parts 27 to 30 to near the downstream end of the gas passage 5.

Furthermore, a vaporizing part that vaporizes a carrier gas having a plurality of thin film forming materials dispersed therein at the disperser 2 is constituted of a reaction pipe 3 and a heater 4.

In the following, the specific configuration of the present invention will be described.

The vaporizer 1 according to the present invention includes the gas passage 5 formed in the inside of the disperser 2 constituting the dispersing unit, a gas inlet port 18$a$ formed on a gas supply pipe 18 so as to communicate with the gas passage 5 for introducing a carrier gas, the thin film forming material supply parts 27 to 30 that supply raw material solutions to the carrier gas passing through the gas passage 5 for making the raw material solutions into mist, an end jet port 5$b$ that supplies the carrier gas containing the raw material solutions in mist to the vaporizing part, the cooling path 6 for a cooling part through which cooling water is circulated for cooling the carrier gas carried through the inside of the gas passage 5, the reaction pipe 3 having one end connected to the reaction pipe of a MOCVD device and the other end connected to the end jet port 5$b$ of the disperser 2, and the heater 4 that heats the reaction pipe 3.

The inside of the disperser 2 has a cylindrical hollow, and the center rod 35 is inserted into the hollow carrier gas introduction hole. The inner wall of the disperser 2 and the center rod 35 form the gas passage 5. It is noted that the carrier gas introduction hole is not limited to a cylindrical shape, which may have other shapes. For example, a cone shape is preferable. Preferably, the conic angle of a cone-shaped carrier gas introduction hole ranges from angles of 0 to 45°, more preferably, angles of 8 to 20°. These are the same in the other embodiments.

It is noted that preferably, the cross sectional area of the gas passage ranges from 0.10 to 0.5 mm$^2$. Processing is difficult if the cross sectional area is blow 0.10 mm$^2$. A necessity arises to use a high pressure carrier gas at a large flow rate in order to increase the rate of a carrier gas if the cross sectional area exceeds 0.5 mm$^2$.

If a carrier gas at a large flow rate is used, a large-sized vacuum pump with a large capacity is necessary to maintain a reaction chamber at a subatmospheric pressure (1.0 Torr, for example). Since it is difficult to adopt a vacuum pump having an evacuation capacity of 10,000 liter/min. (at, 1.0 Torr), an appropriate flow rate, that is, the gas passage area ranging from 0.10 to 0.5 mm$^2$, is preferable, in order to achieve industrially practical use.

The gas inlet port 18a is provided on one end of the gas passage 5. A gas cylinder 11 for a carrier gas (at least any one of $N_2$, Ar, and He, for example) is connected to the gas inlet port 18a.

The thin film forming material supply parts 27 to 30 are provided in almost the center part of the disperser 2 so as to communicate with the gas passage 5, in which raw material solutions are dropped and introduced into the gas passage 5 and the raw material solutions are dispersed in the carrier gas passing through the gas passage 5, so that the raw material solutions can be made into a raw material gas.

An anti-radiation part 37 is provided at one end of the gas passage 5, in which the end jet port 5b communicating with the reaction pipe 3 is formed.

The disperser 2 is formed with the cooling path 6 that circulates cooling water. The cooling water is carried through the cooling path 6, so that the carrier gas carried through the inside of the gas passage 5 is cooled. It is noted that a Peltier element or the like may be provided for cooling, instead of the cooling path 6. In addition, since the inside of the gas passage 5 is subject to heat caused by the heater 4, only a solvent is vaporized without vaporizing the solvent and organometallic complexes in the raw material solutions at the same time in the inside of the gas passage 5. Therefore, preferably, the vaporization of only the solvent is prevented by cooling the carrier gas carried through the inside of the gas passage 5, the carrier gas having the raw material solutions dispersed therein. At this time, since it is particularly important to cool the downstream side of the gas passage 5 more than the thin film forming material supply parts 27 to 30, it is preferable to cool the inside of the gas passage 5 on the downstream side more than at least the thin film forming material supply parts 27 to 30. It is noted that the cooling temperature is a temperature of the boiling point of a solvent or less (a temperature of 67° C. or less for THF, for example). More particularly, the temperature at the end jet port 5b is important.

Thus, as shown in FIGS. 2A and 2B, the cooling member insertion hole 35a is formed on the axis of the center rod 35 according to the present invention, and the cooling member 36 that directly cools the inside of the center rod 35 is disposed in the cooling member insertion hole 35a. It is noted that the outer circumferential portion of the center rod 35 is formed with a plurality of guide grooves 35b that efficiently supply thin film forming materials to be applied to the downstream side and correspond to the thin film forming material supply parts 27 to 30 one to one.

It is noted that the center rod 35 is tapered so as to close to each other in the axial direction from the midway to the start upstream port 5a side as shown in FIG. 2A.

At this time, preferably, the end portion is formed in a cone (or a truncated cone). The carrier gas introduction hole in the disperser 2 is formed so as to follow the shape of this tip end portion, so that the gas passage 5 is joined at the end jet port 5b (a joining part). It is noted that the end portion 37a may be formed in a pyramid (or a truncated pyramid). At this time, for the number of corners (the number of faces), a quadrangular pyramid is adopted as corresponding to four thin film forming material supply parts 27 to 30. However, a polygonal pyramid can be adopted in which the number of faces corresponds to the number of the gas passages 5, that is, the number of raw material solutions (thin film forming raw materials) corresponding to the number of the reserve tanks 14 to 17. It is noted that the guide groove 35b is of course formed in each face in this case. In addition, although the end jet port 5b is made at the joining part, the joining part may be provided on the upstream side in the direction of carrying the carrier gas more than the end jet port 5b.

For the cooling member 36, one in a cylindrical shape, for example, is used in which the outer side is a heat absorption side and the inner side is the heat dissipation side. It is noted that 36a and 36b denote wiring codes of the cooling member 36 in FIG. 2B.

Figure 3:
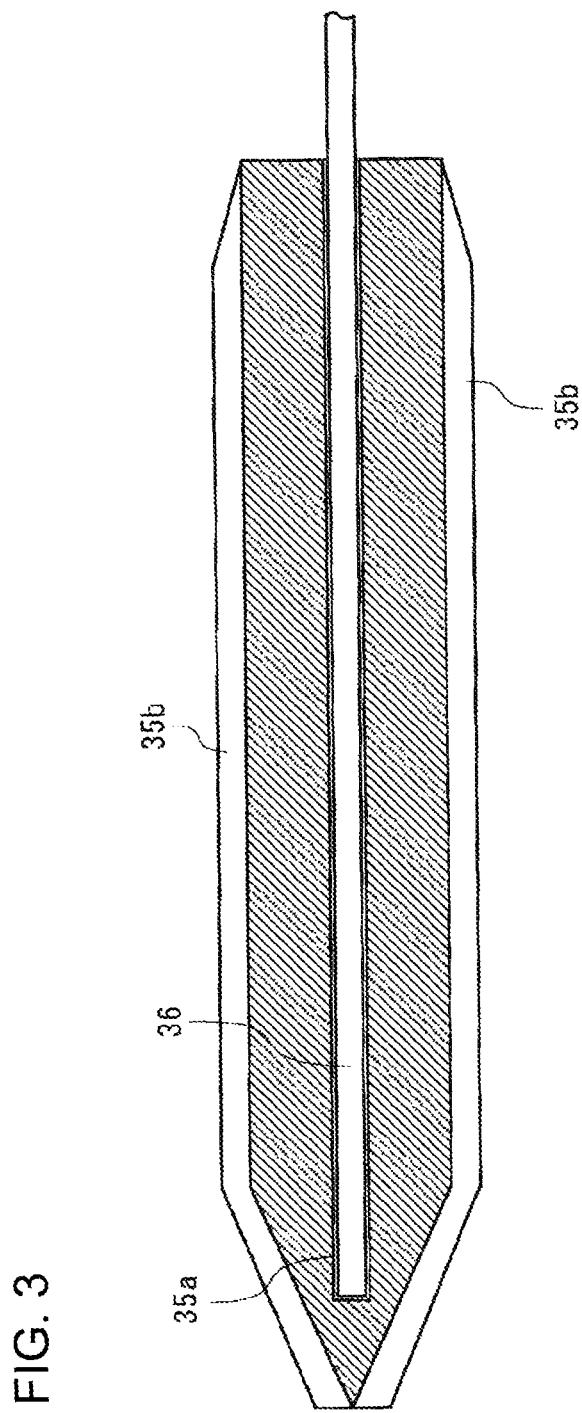
FIG. 3 is a vertical cross sectional view depicting a center rod 35 of an exemplary modification 1 applied to the MOCVD vaporizer according to the present invention.
Figure 4:
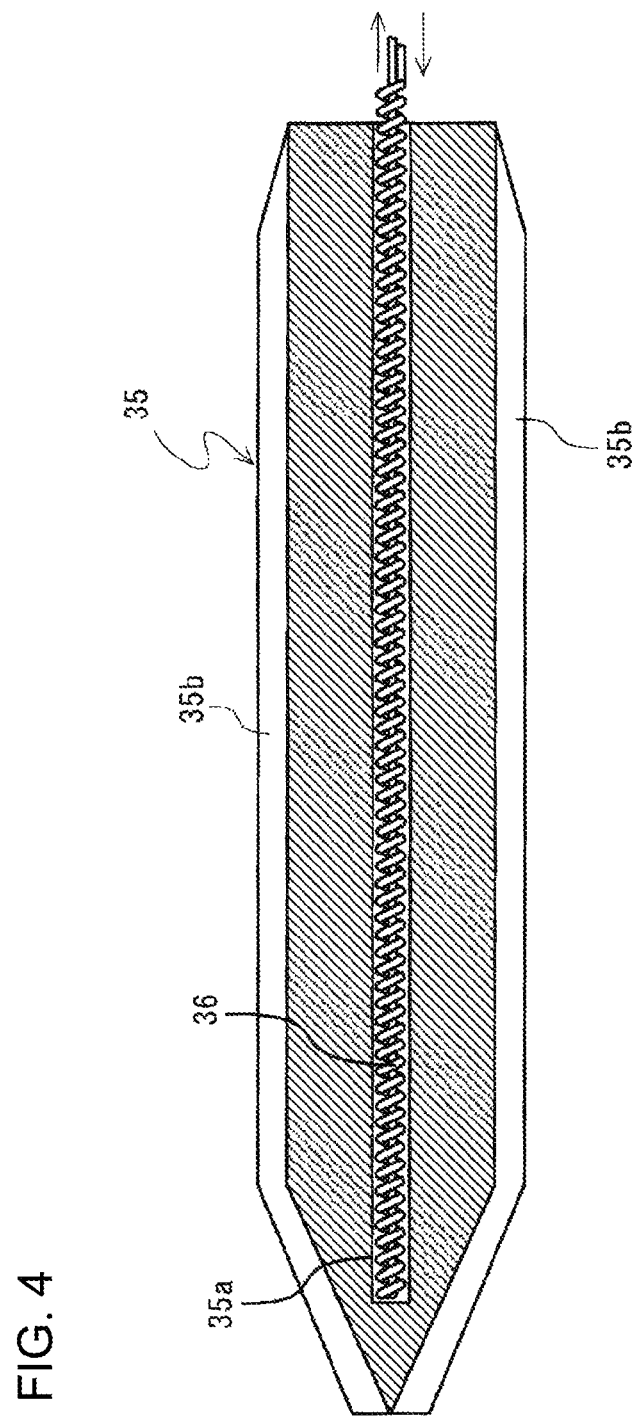
FIG. 4 is a vertical cross sectional view depicting a center rod 35 of an exemplary modification 2 applied to the MOCVD vaporizer according to the present invention.
Figure 5:
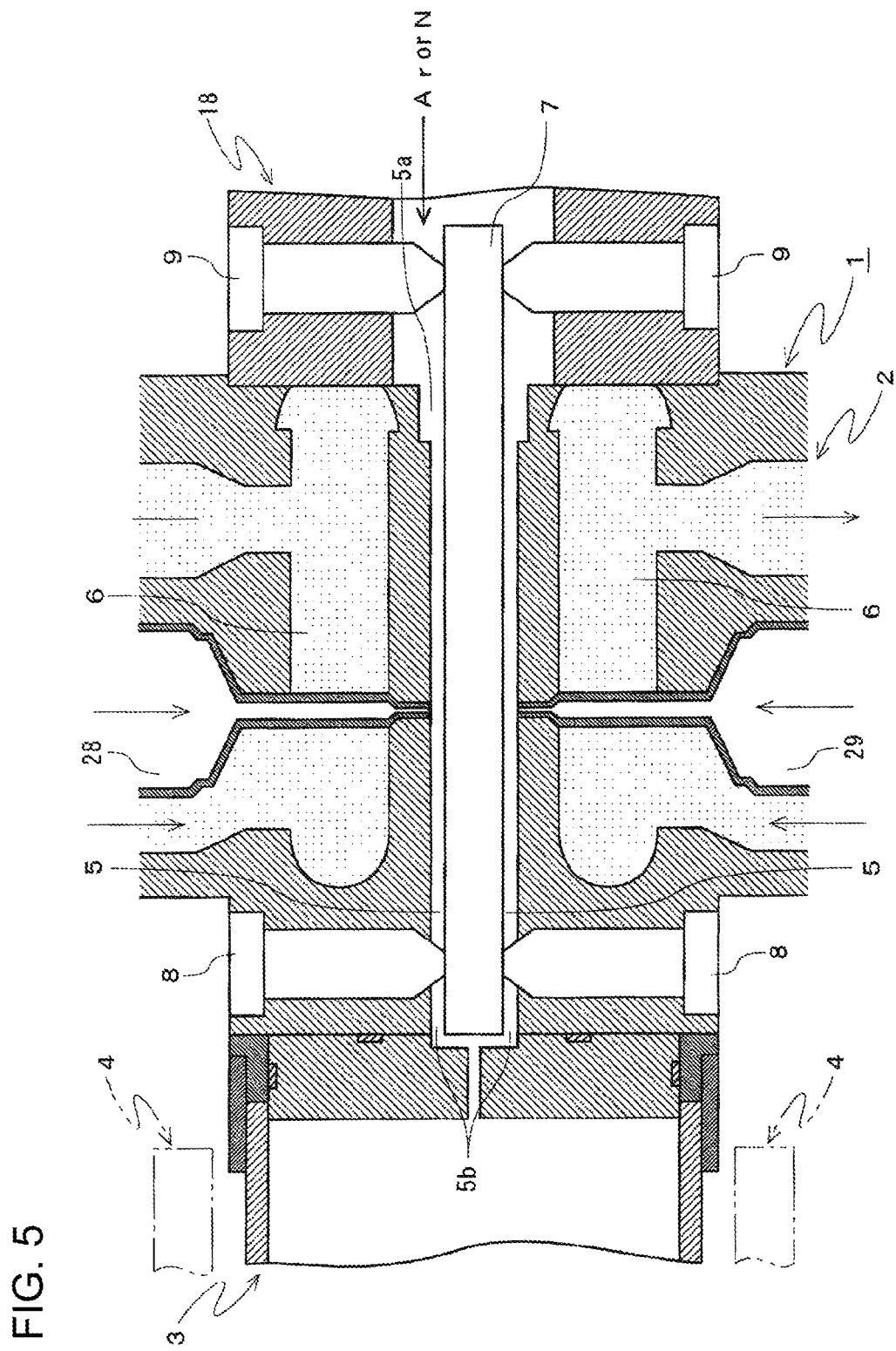
FIG. 5 is a cross sectional view depicting the essential part of a conventional vaporizer.
Figure 6:
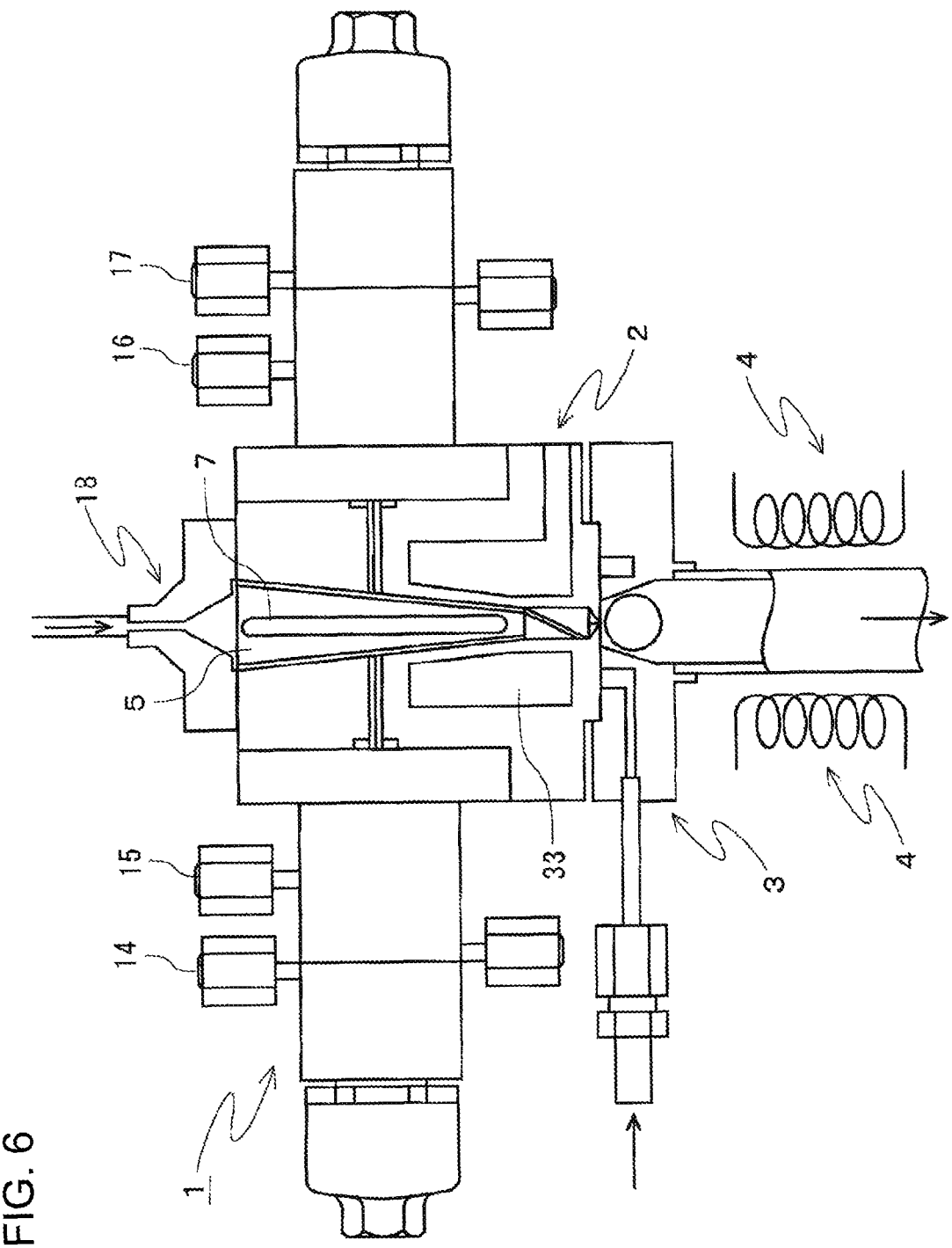
FIG. 6 is a cross sectional view depicting the essential part of another conventional vaporizer.

It is noted that the cooling member 36 is not limited particularly, such as a heat pipe that the heat absorption side is positioned on the inside of the cooling member insertion hole 35a and the heat dissipation side positioned on the outside of the cooling member insertion hole 35a as shown in FIG. 3, for example, and a spiral (or nearly U-shaped) cold water pipe that circulates cooling water as shown in FIG. 4. However, preferably, the cooling member 36 has a shape (thickness or the like) according to cooling temperature. Moreover, the cooling member 36 is not formed in a cooling passage or the like directly formed in the center rod 35, so that it is possible to contribute to facilitating the formation of the center rod 35 and to facilitating maintenance such as disassemble. Furthermore, the cooling member 36 is disposed across almost the entire length of the center rod 35 to cool a carrier gas beforehand. However, such a configuration may be possible that the cooling member 36 cools the inside of the gas passage 5 on the downstream side more than at least the thin film forming material supply parts 27 to 30 if the cooling temperature of the cooling member 36 can be surely made higher.

Sealing members 38 and 39 such as an O-ring surely provide sealing properties for the anti-radiation part 37 having the end jet port 5b formed thereon. It is noted that preferably, the anti-radiation part 37 is formed using a material having an excellent thermal conductivity such as Teflon (registered trademark), stainless steel, or ceramics, for example.

According to the findings of the present inventors, in the configuration in which only the outside of the gas passage 5 is cooled as described in the conventional techniques, the heat in the vaporizing part overheats a gas in the inside of the gas passage 5 as radiant heat through the end jetport 5b. Therefore, even though the outside of the gas passage 5 is cooled with cooling water, a low melting point component in the carrier gas is precipitated near the end jet port 5b.

Thus, the aforementioned cooling member 36 is disposed and the anti-radiation part 37 is further disposed, so that it is possible to further suppress the propagation of such radiant heat to a carrier gas. Therefore, preferably, the cross sectional area of the end jet port 5b is made smaller than the cross sectional area of the gas passage 5 (for example, ½ or less, more preferably, ⅓ or less). Moreover, preferably, the end jet port 5b is downsized. More particularly, preferably, the end jet port 5b is downsized in the dimensions in which the flow rate of an issuing gas is subsonic speed.

Furthermore, preferably, the length of the end jet port 5b is five times the cross sectional dimensions of the end jet port 5b or more, more preferably, ten times or more.

In addition, the disperser 2 is cooled to suppress the occurrence of blocking caused by carbides in the inside of the gas passage 5 (particularly the end jet port 5b) for a long-term use.

The reaction pipe 3 is connected on the downstream side of the disperser 2. The disperser 2 and the reaction pipe 3 can be connected using a joint or the like.

In the foregoing configuration, a carrier gas is introduced into the gas passage 5 formed between the inner wall of the carrier gas introduction hole formed in the disperser 2 and the center rod 35 inserted into the carrier gas introduction hole. Thin film forming materials are introduced from a plurality of places in the midway of the gas passage 5, and the thin film forming materials are dispersed into a carrier gas. After at least the carrier gas having the thin film forming materials dispersed therein is guided to the joining part while cooling the carrier gas having the thin film forming materials dispersed therein using the cooling path 6 disposed in the disperser 2 and the cooling member 36 disposed in the center rod 35, the thin film forming materials being introduced from the plurality of places in the midway of the gas passage 5. The carrier gas having the thin film forming materials dispersed therein is joined at the joining part where the tip end of the center rod 35 disposed on the downstream end portion of the gas passage 5 guides the thin film forming materials in the direction to come close to each other. The carrier gas is heated and vaporized by the heater 4, and then the carrier gas is supplied to the thin film deposition device, not shown in the drawing.

INDUSTRIAL APPLICABILITY

As described above, according to the present invention, it is possible to provide a vaporizer that can efficiently cool a carrier gas, improve the effect of preventing a material from being clogged near the outlet port of a gas passage, contribute to prolonging the timing of maintenance and improving operating efficiency, and exert more uniform dispersing effect.

The invention claimed is:

1. A center rod constructed and arranged for use in a vaporizer, the vaporizer comprising:
   a center rod inserted into a carrier gas introduction hole formed in a dispersing unit main body to form a gas passage in cooperation with an inner wall of the carrier gas introduction hole;
   a cooling part disposed on an outer circumferential side of the carrier gas introduction hole in the dispersing unit main body and configured to cool an inside of the gas passage;
   a cooling member insertion hole formed across almost an entire length of the center rod along an axial direction of the center rod; and
   a cooling member disposed in an inside of the cooling member insertion hole and configured to cool the center rod;
   wherein the center rod includes a plurality of guide grooves formed on an outer circumferential portion of the center rod, the plurality of guide grooves corresponding to thin film forming materials to be applied one to one.

2. The center rod according to claim 1,
   wherein the cooling member is a Peltier element in a nearly cylindrical shape.

3. The center rod according to claim 1,
   wherein the cooling member is a heat pipe having a heat absorption part disposed in the cooling member insertion hole.

4. The center rod according to claim 1,
   wherein the cooling member is a spiral or nearly U-shaped cold water pipe, to and from which cooling water is supplied and drained through a pump.

5. The center rod according to claim 1,
   wherein the cooling member is removably inserted into the center rod.

6. The center rod of claim 1, wherein the vaporizer is an MOCVD vaporizer comprising a vaporizing part provided adjacent to the vaporizer and configured to vaporize a carrier gas having a plurality of thin film forming materials dispersed therein in the dispersing unit main body,
   wherein the center rod comprises a plurality of guide grooves formed on an outer circumferential portion of the center rod, the plurality of guide grooves corresponding to thin film forming materials to be applied one to one.

7. The center rod according to claim 2,
   wherein the cooling member is removably inserted into the center rod.

8. The center rod according to claim 3,
   wherein the cooling member is removably inserted into the center rod.

9. The center rod according to claim 4,
   wherein the cooling member is removably inserted into the center rod.

10. A center rod constructed and arranged for use in a vaporizer, the vaporizer comprising:
    a center rod inserted across an entire length of a carrier gas introduction hole formed in a dispersing unit main body to form a gas passage in cooperation with an inner wall of the carrier gas introduction hole;
    a thin film forming material supply part formed at a plurality of places in the dispersing unit main body and configured to supply a plurality of thin film forming materials to a midway of the gas passage;
    a cooling part disposed on an outer circumferential side of the carrier gas introduction hole in the dispersing unit main body and configured to cool an inside of the gas passage;
    a cooling member insertion hole formed across almost an entire length of the center rod along an axial direction of the center rod; and
    a cooling member disposed in an inside of the cooling member insertion hole and configured to cool the center rod;
    wherein the center rod includes a plurality of guide grooves formed on an outer circumferential portion of the center rod, the plurality of guide grooves corresponding to thin film forming materials to be applied one to one.

11. The center rod of claim 10, further comprising a plurality of guide grooves formed on an outer circumferential portion of the center rod, the plurality of guide grooves corresponding to thin film forming materials to be applied one to one.

* * * * *